United States Patent
Sato

(10) Patent No.: US 6,482,743 B1
(45) Date of Patent: Nov. 19, 2002

(54) METHOD OF FORMING A SEMICONDUCTOR DEVICE USING CMP TO POLISH A METAL FILM

(75) Inventor: Junichi Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/660,796

(22) Filed: Sep. 13, 2000

(30) Foreign Application Priority Data

Sep. 13, 1999 (JP) ........................................... 11-259098

(51) Int. Cl.⁷ ...................... H01L 21/302; H01L 21/461
(52) U.S. Cl. ........................ 438/692; 438/633; 438/626; 438/691
(58) Field of Search ................................ 438/690, 691, 438/692, 693, 697, 622, 625, 626, 631, 633, 687; 216/52, 88, 89; 451/905, 909

(56) References Cited

U.S. PATENT DOCUMENTS 5,773,360 A * 6/1998 Chang et al. ............... 438/626
6,189,546 B1 * 2/2001 Zhang et al. ................ 134/1.3
6,214,098 B1 * 4/2001 Lee ............................... 106/3
6,218,290 B1 * 4/2001 Schonauer et al. .......... 438/633
6,270,397 B1 * 8/2001 Wu ............................. 451/288

OTHER PUBLICATIONS

Wijekoon et al, "Development of a Production Worthy Copper CMP Process", Avd. Semiconductor Manufacture Conf., Sep. 25, 1998, pp 354–363.*

* cited by examiner

Primary Examiner—Tuan H. Nguyen
Assistant Examiner—Thanhha Pham
(74) Attorney, Agent, or Firm—Sonnenschein, Nath & Rosenthal

(57) ABSTRACT

For the purpose of providing a semiconductor and its manufacturing that can attain local smoothing by removing local defective surface morphology while attaining global surface smoothing, a substrate surface is smoothed by conducting chemical mechanical polishing in a plurality of separate steps using different types of slurry which are different in degree of dispersion of abrasive particles. For example, chemical mechanical polishing is first conducted by using non-suspension-type slurry, and chemical mechanical polishing is next conducted by using suspension-type slurry. By polishing a Cu film, for example, by using this chemical mechanical polishing, a plug is made in a via hole.

25 Claims, 5 Drawing Sheets

US 6,482,743 B1

METHOD OF FORMING A SEMICONDUCTOR DEVICE USING CMP TO POLISH A METAL FILM

RELATED APPLICATION DATA

The present application claims priority to Japanese Application No. P11-259098 filed Sep. 13, 1999, which application is incorporated herein by reference to the extent permitted by law.

BACKGROUND OF THE INVENTION

1. Field of the Invention

This invention relates to a semiconductor device and its manufacturing method, especially suitable for application to a semiconductor integrated circuit device having multi-layered wiring.

2. Description of the Related Art

Along with progressively high integration of elements for semiconductor integrated circuit devices, wiring techniques are moving, toward further microminiaturization and multi-layered structures. It is said, for example, that logical LSI having the design rule of 0.18 micron class requires multi-layered wiring of six or more layers. Therefore, multi-layered wiring processes are getting more and more important in manufacturing processes of semiconductor integrated circuit devices.

However, developments of microminiaturization and multi-layered structures of wiring invited a new problem. That is, since developments of microminiaturization and multi-layered structures of wiring make level differences of inter-layer insulating films large and sharp, it is difficult to make a metal wiring pattern thereon freely from breakage at different levels or other faults.

To solve this problem, chemical mechanical polishing (CMP) has been introduced and used in a wiring process. This method is configured to smooth the surface of an inter-layer insulating film completely by CMP and thereafter make metal wiring thereon. Alternatively, the method is configured to make a via hole in the inter-layer insulating film for electrically connecting upper and lower wiring layers. The method then buries a metal film in the via hole, and subsequently polishes and smooths the metal film by CMP to make a plug in the via hole.

Here is explained a conventional chemical mechanical polishing unit. An example thereof is shown in FIG. 1. As shown in FIG. 1, the chemical mechanical polishing unit includes, as its major components, an abrasive plate 103 which has an abrasive cloth 101 fixed to it and rotates in the arrow-marked direction 102 in FIG. 1 with an external driving force; a carrier 106 which holds a substrate 104, such as a wafer, to be polished and urges it onto the abrasive cloth 101 with a polishing pressure, and rotates in the arrow-marked direction 105 in FIG. 1 with an external driving force. The chemical mechanical polishing unit also includes a slurry supply system 107 which supplies an abrasive agent, i.e. slurry, prepared by suspending abrasive particles of silica or alumina, for example, in water containing a pH adjusting agent. From one end of a slurry supply opening 108 attached to the slurry supply system 107, slurry 109 is poured down to near the rotation center of the abrasive plate 103, and the poured slurry 109 is spread over the abrasive cloth 101 due to a centrifugal force produced by rotation of the abrasive plate 103. Then, while supplying the slurry 109 in this manner, both the abrasive plate 103 and the carrier 106 are rotated to rub the substrate 104 with the abrasive cloth 101 and thereby grind the surface of the substrate 104. At that time, depending upon the material to be polished, namely, insulating film or metal film, chemical mechanical polishing is effected in a basic or acidic atmosphere.

Chemical mechanical polishing is currently the most effective smoothing method, but it still involves various problems. One problem is the difficulty of burying a metal in via holes by sputtering that has been used for making a metal film, because of progressive reduction of the diameter of the via holes due to microminiaturization. Recently, therefore, electrolytic plating or CVD is often used for making metal films instead of sputtering. On the other hand, there is an active trial to use copper (Cu) having a low specific resistance, high resistance to electro migration and high reliability as wiring metal instead of aluminum (Al) alloys heretofore used. However, when Cu is used to make a film by electrolytic plating, post-plating configuration is not yet satisfactory. More specifically, as shown in FIG. 2A, in the case where a Cu film 204 is made by electrolytic plating after via holes 203 are made in an inter-layer insulating film 202 stacked to cover a base-layer wiring 201 of a substrate, not shown, an unevenness is produced on its surface, reflecting the density of the via holes 203 made in the inter-layer insulating film 202. Therefore, if the Cu film 204 is polished by using slurry of a suspension type normally used for chemical mechanical polishing, the liquid of the slurry forms a thin liquid film between the substrate to be polished and the abrasive cloth, and cause a so-called hydro plane phenomenon. This is similar to the phenomenon that, when a car runs on a highway in rain, rain makes a thin liquid film between the road surface and tires and makes tires liable to slip. Here is remarked the problem that, due to this hydro plain phenomenon, a kind of gap is produced between the abrasive cloth and the substrate and disturbs smoothing by polishing, and the surface configuration of plugs 205 of the Cu film left in the via holes 203 after polishing remain uneven without being smoothed sufficiently. As a result, if an overlying inter-layer insulating film is formed after the plugs 205 are made, undesirable configuration of the plugs 205 and failure to bury the upper plug material in the via holes, for example, might decrease the production yield of semiconductor integrated circuit devices.

Under the circumstances, active studies are being made toward CMP not using slurry. Since this method does not use slurry, the above-mentioned problem does not occur. However, in simple words, this method is similar to grind a surface with a file, and it has the drawback that the evenness of the surface after polishing is inferior to that by CMP using slurry.

Under the above-explained background, for the next-generation semiconductor integrated circuit devices, there has been a demand for chemical mechanical polishing capable of accomplishing global surface evenness while accomplishing local surface evenness as well.

OBJECTS AND SUMMARY OF THE INVENTION

It is therefore an object of the invention to provide a semiconductor device and its manufacturing method capable of accomplishing global surface evenness while also accomplishing local evenness by removing defects of local surface configuration.

A more general object of the invention is to provide a semiconductor device and its manufacturing method capable of optimizing polishing and obtaining well-smoothed configuration.

To solve the above-indicated problems involved in the conventional techniques, the Inventor made a hard study. Its outline is explained below.

Today's chemical mechanical polishing uses suspension-type slurry for polishing from its starting process. Therefore, if the workpiece to be polished has an unevenness on its surface when polishing is started, the suspension-type slurry causes the above-indicated hydro plain phenomenon between the surface to be polished and the abrasive cloth, and polishing progresses while uneven portions particularly requiring polishing on the workpiece to be polished does not contact the abrasive cloth sufficiently. As a result, the surface configuration after polishing remains insufficient in evenness. Thus, the Inventor made various researches, and found that the surface after polishing was made more compact and smooth by conducting rough smoothing by using non-suspension-type slurry in the first step of polishing so as to remove projecting portions only by physical motions of abrasive particles and thereafter executing polishing by using suspension-type slurry.

The inventor made further studies, and realized, as a result of again reviewing the above-mentioned suspension-type slurry and non-suspension-type slurry from the standpoint of the degree of distribution of abrasive particles in the slurry, that it was effective for better smoothing, in a more general sense, to conduct some occurrences of chemical mechanical polishing by using different kinds of slurry that are different in the degree of distribution of abrasive particles, depending upon the surface configuration of the workpiece to be smoothed or the material of the work piece. More specifically, in the case where a large unevenness exists on the surface of a workpiece to be polished, for example, it is effective to first use slurry with a small amount of abrasive particles (its utmost example is non-suspension-type slurry) for chemical mechanical polishing to remove projections and roughly smooth the surface, and thereafter using slurry with a larger amount of abrasive particles (for example, suspension-type slurry similar to the conventional one, for example) to progress the polishing.

This invention has been made through those researches and studies of the Inventor.

According to the first aspect of the invention, there is provided a method for manufacturing a semiconductor device comprising the step of:

conducting chemical mechanical polishing in a plurality of separate steps by using different type of slurry which are different in degree of dispersion of abrasive particles.

According to the second aspect of the invention, there is provided a semiconductor device comprising a substrate whose surface is smoothed by chemical mechanical polishing using different types of slurry which are different in degree of dispersion of abrasive particles.

The "degree of dispersion of abrasive particles" indicates uniformity of distribution of abrasive particles in slurry. When abrasive particles distribute in slurry completely uniformly, the degree of dispersion of abrasive particles is the largest, and as the distribution becomes nonuniform, degree of dispersion of abrasive particles becomes smaller. It is a general tendency that abrasion by physical actions of abrasive particles becomes dominant as the degree of dispersion of abrasive particles in slurry becomes smaller.

In a typical mode of the present invention, chemical mechanical polishing is conducted over a plurality of times while increasing the degree of dispersion of abrasive particles in slurry from one step to another. More specifically, in the first chemical mechanical polishing, for example, non-suspension-type slurry is used. Most typically, chemical mechanical polishing is first conducted by using non-suspension-type slurry, and chemical mechanical polishing is next conducted by using suspension-type slurry.

According to the intention having the above-summarized configuration, by performing chemical mechanical polishing over a plurality of times by using different kinds of slurry which are different in degree of dispersion of abrasive particles, slurry with optimum degree of dispersion of abrasive particles can be selected for polishing from time to time upon the start of polishing and during progress of polishing, depending upon the surface unevenness and the material of the workpiece to be polished, and optimum polishing is ensured. Especially, by first conducting chemical mechanical polishing by using non-suspension-type slurry, the hydro plain phenomenon can be prevented, and projections on the surface of the workpiece can be removed exclusively by physical motions of abrasive particles to roughly smooth the surface. Then, by next conducting chemical mechanical polishing, using suspension-type slurry, the surface of the workpiece can be smoothed to a compact, excellent configuration.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are explained below with reference to the drawings.

Figure 1:
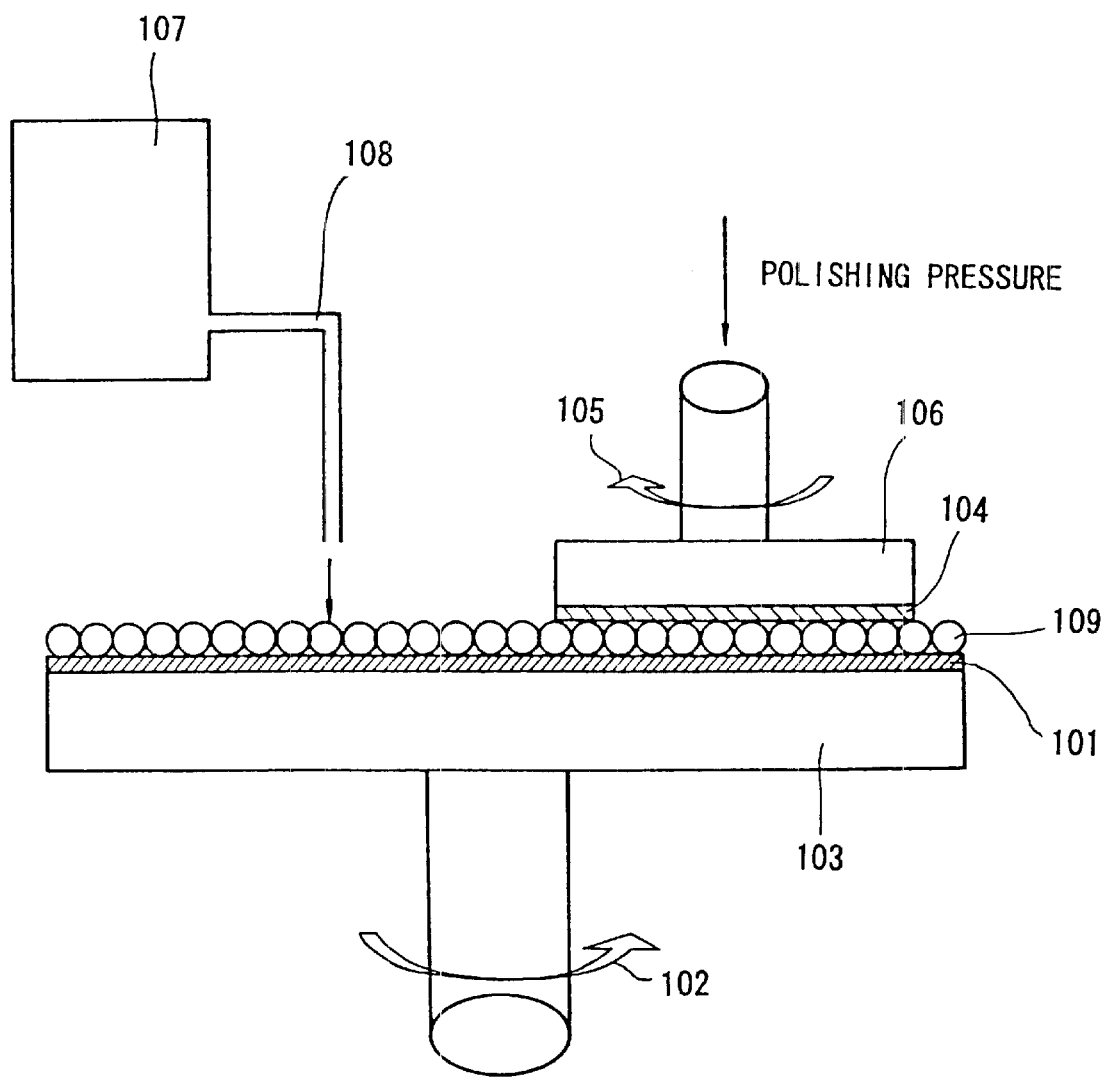
FIG. 1 is a schematic diagram which shows a conventional chemical mechanical polishing unit.
Figure 2A:
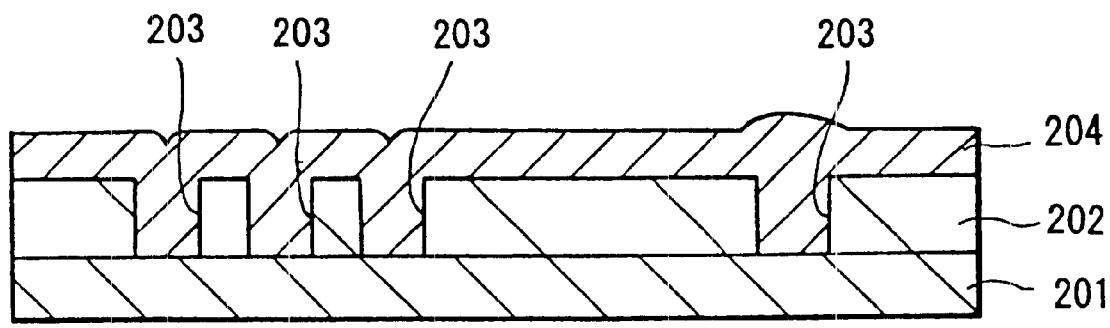
FIGS. 2A and 2B are cross-sectional views which show a process of making plugs by conventional chemical mechanical polishing.
Figure 2B:
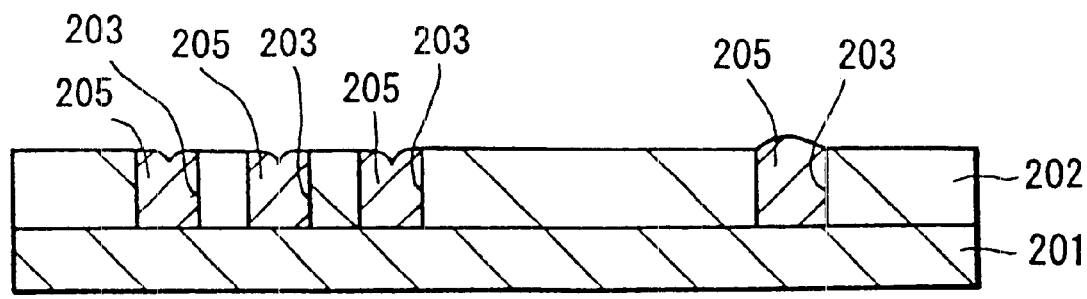
Figure 3:
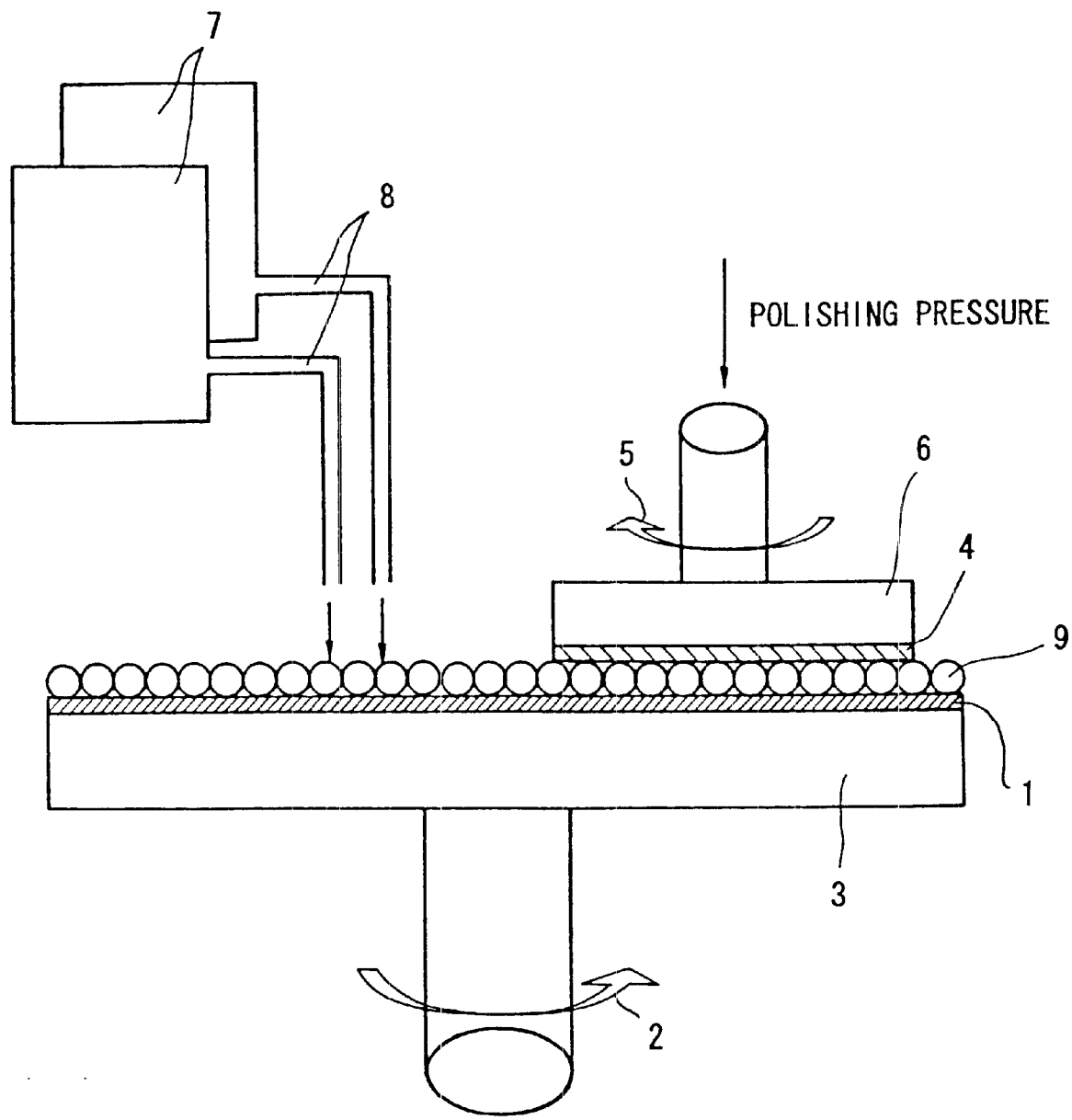
FIG. 3 is a schematic diagram which shows a chemical mechanical polishing unit used in the fist and second embodiments of the invention.

First explained is a chemical mechanical polishing unit used for polishing in the first and second embodiments. FIG. 3 shows the chemical mechanical polishing unit.

As shown in FIG. 3, the chemical mechanical polishing unit includes, as its major components, an abrasive plate 3 which has an abrasive cloth 1 fixed to it and rotates in the arrow-marked direction 2 in FIG. 3 with an external driving force; a carrier 6 which holds a substrate 4 like a wafer to be polished and urges it onto the abrasive cloth 1 with a polishing pressure, and rotates in the arrow-marked direction 5 in FIG. 3 with an external driving force, and slurry supply systems 7 which supply slurry. One of features of this unit lies in having two slurry supply systems 7. One of them supplies suspension-type slurry, and the other supplies non-suspension-type slurry. In a tank of the slurry supply system 7 for supplying non-suspension-type slurry, the slurry is stirred from time to time. From one end of a slurry supply opening 8 attached to the slurry supply system 7, slurry 9 is poured down to near the rotation center of the abrasive plate 3, and the poured slurry 9 is spread over the abrasive cloth 1 due to a centrifugal force produced by rotation of the abrasive plate 3. Then, while supplying the slurry 9 in this manner, both the abrasive plate 3 and the carrier 6 are rotated to rub the substrate 4 with the abrasive cloth 1 and thereby grind the surface of the substrate 4. At that time, depending upon the material to be polished, namely, insulating film or metal film, chemical mechanical polishing is effected in a basic or acidic atmosphere.

Figure 4A:
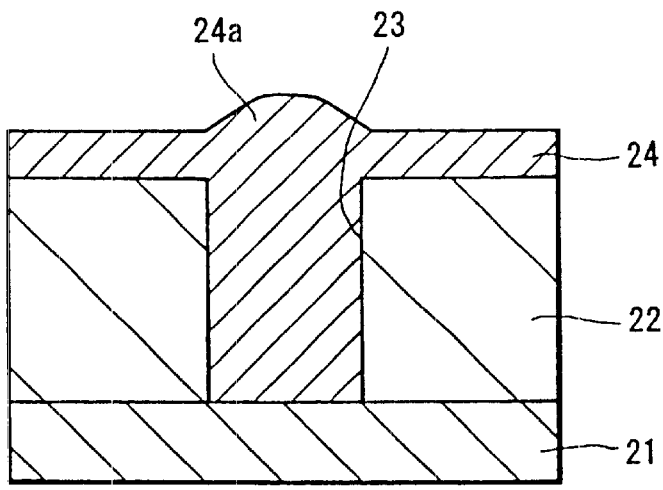
FIGS. 4A through 4C are cross-sectional diagrams for explaining a method for manufacturing a semiconductor integrated circuit device according to the first embodiment of the invention.
Figure 4B:
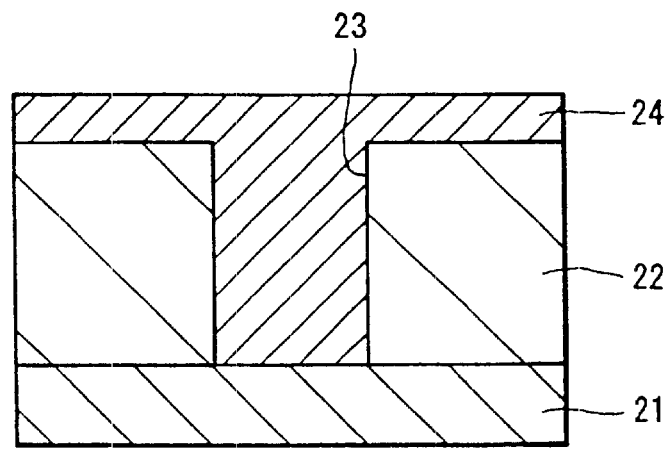
Figure 4C:
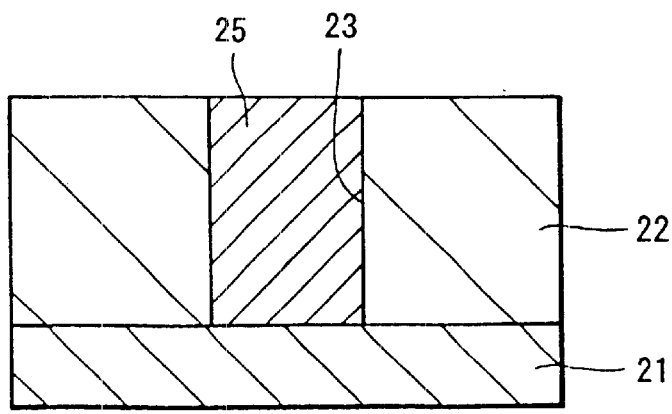

FIGS. 4A through 4C show a memory-built-in semiconductor integrated circuit device according to the first embodiment of the invention, and especially show a connecting portion of multi-layered wiring.

In the semiconductor integrated circuit device according to the first embodiment, as shown in FIG. 4A, a $SiO_2$ film, for example is formed as an inter-layer insulating film 22 to cover a lower wiring layer 21 formed on a semiconductor substrate such as Si substrate, not shown. After that, this inter-layer insulating film 22 is selectively removed by ordinary dry etching to make a via hole 23.

After that, a Cu film 24 is deposited on the entire substrate surface by electrolytic plating. At that time, a projection 24a is produced on the Cu film 24 above the via hole 23. If the Cu film 24 in this status undergoes polishing by conventional CMP using suspension-type slurry, a thin liquid film produced by suspension-type slurry between the projection 24a and the abrasive cloth (hydroplane phenomenon) will result in defective configuration after polishing, as already discussed above.

Subsequently, the Cu film 24 is polished in the following way by using the chemical mechanical polishing unit shown in FIG. 3. As the first step, one of the slurry supply systems 7 of the chemical mechanical polishing unit shown in FIG. 3 is selected for supplying non-suspension-type slurry, and while the non-suspension-type slurry is supplied onto the substrate from the slurry supply opening 8, polishing is conducted under the following conditions.

| | |
|---|---|
| Revolution of the abrasive plate: | 50 rpm |
| Revolution of the carrier: | 17 rpm |
| Polishing pressure | 20 psi |
| Temperature of the abrasive cloth: | 30 through 40° C. |
| Flow rate of slurry: | 250 ml/min |

Used in this process was slurry prepared by mixing alumina particles into a KOH water solution for alkalization.

As a result of this polishing using the non-suspension-type slurry, because a physical function by an urging pressure and non-suspension-type alumina particles produced additive effects and because the hydro plain phenomenon did not occur, the projection 24a was removed and smoothed although the surface after polishing was still rough. This aspect is shown in FIG. 4B.

After polishing with non-suspension-type slurry as explained above, the slurry supply system 7 of the chemical mechanical polishing unit shown in FIG. 3 is changed to another for supplying suspension-type slurry, and while supplying this suspension-type slurry from the slurry supply opening 8, the second step polishing is conducted under the following conditions. In the second step, polishing is continued until the Cu film 24 on the inter-layer insulating film 22 is fully removed. In the second step, the polishing pressure is set lower than the first step in order to obtain a compact, smooth configuration.

| | |
|---|---|
| Revolution of the abrasive plate: | 50 rpm |
| Revolution of the carrier: | 17 rpm |
| Polishing pressure | 10 psi |
| Temperature of the abrasive cloth: | 30 through 40° C. |
| Flow rate of slurry: | 250 ml/min |

Used in this process was slurry prepared by suspending alumina particles in a KOH water solution and an alcohol solution for its alkalization.

In this polishing using the suspension-type slurry, the surface roughly smoothed in the first step is smoothed compactly, and as shown in FIG. 4C, an excellent smoothed configuration can be obtained. Then, the Cu film 24 on the inter-layer insulating film 24 is fully removed, and remains only the via hole 23 to make up the plug 25.

After that, although not shown, by making an upper wiring layer electrically connected to the lower wiring layer 21 by the plug 25 and executing steps necessary for making a still upper inter-layer insulating film, the intended semiconductor integrated circuit device is completed.

As explained above, according to the first embodiment, by conducting chemical mechanical polishing of the Cu film 24 through two separate steps to grind it by using the non-suspension-type slurry in the first step and thereby remove the projection 24a from the surface and roughly smooth the surface by a physical function, and to conduct polishing using the suspension-type slurry in the second step, the surface configuration of the plug 25 after polishing can be smoothed into a compact and excellent configuration.

This technique is suitable for use in the next-generation ULSI, and can promise a high production yield.

Next explained is the second embodiment of the invention. The second embodiment is an application of the invention to a memory-built-in semiconductor integrated circuit device similarly to the first embodiment.

In the second embodiment, after progressing the process up to formation of the via hole 23 similarly to the first embodiment, the Cu film 24 is stacked on the entire substrate surface. The second embodiment, however, uses low-pressure CVD for stacking the Cu film 24. At that time, the Cu film 24 includes the projection 24a above the via hole 23. The Cu film 24 made by low-pressure CVD is normally more compact than that made by electrolytic plating.

After that, using the chemical mechanical polishing unit shown in FIG. 3, the Cu film 24 is ground in the following manner. As the first step, one of the slurry supply systems 7 of the chemical mechanical polishing unit shown in FIG. 3 is selected for supplying non-suspension-type slurry, and while the non-suspension-type slurry is supplied onto the substrate from the slurry supply opening 8, polishing is conducted under the following conditions. Among these conditions, revolution of the abrasive plate and revolution of the carrier are increased as compared with those of the first embodiment. This is because the Cu film 24, when made by low-pressure CVD, is more compact than the Cu film 24 made by electrolytic plating.

| | |
|---|---|
| Revolution of the abrasive plate: | 65 rpm |
| Revolution of the carrier: | 22 rpm |
| Polishing pressure | 20 psi |
| Temperature of the abrasive cloth: | 30 through 40° C. |
| Flow rate of slurry: | 250 ml/min |

Used in this process was slurry prepared by mixing alumina particles into a KOH water solution for alkalization.

As a result of this polishing using the non-suspension-type slurry, because a physical function by an urging pressure and non-suspension-type alumina particles produced additive effects and because the hydro plain phenomenon did not occur, the projection 24a was removed and smoothed although the surface after polishing was still rough.

After polishing with non-suspension-type slurry as explained above, the slurry supply system 7 of the chemical mechanical polishing unit shown in FIG. 3 is changed to another for supplying suspension-type slurry, and while supplying this suspension-type slurry from the slurry supply opening 8, the second step polishing is conducted under the following conditions. In the second step, polishing is continued until the Cu film 24 on the inter-layer insulating film 22 is fully removed. In the second step, the polishing pressure is set lower than the first step in order to obtain a compact, smooth configuration.

| | |
|---|---|
| Revolution of the abrasive plate: | 65 rpm |
| Revolution of the carrier: | 22 rpm |
| Polishing pressure | 10 psi |
| Temperature of the abrasive cloth: | 30 through 40° C. |
| Flow rate of slurry: | 250 ml/min |

Used in this process was slurry prepared by suspending alumina particles in a KOH water solution and an alcohol solution for its alkalization.

In this polishing using the suspension-type slurry, the surface roughly smoothed in the first step is smoothed compactly, and as shown in FIG. 4C, an excellent smoothed configuration can be obtained. Then, the Cu film 24 on the inter-layer insulating film 24 is fully removed, and remains only the via hole 23 to make up the plug 25.

According to the second embodiment, the same advantages as those of the first embodiment can be obtained.

Figure 5:
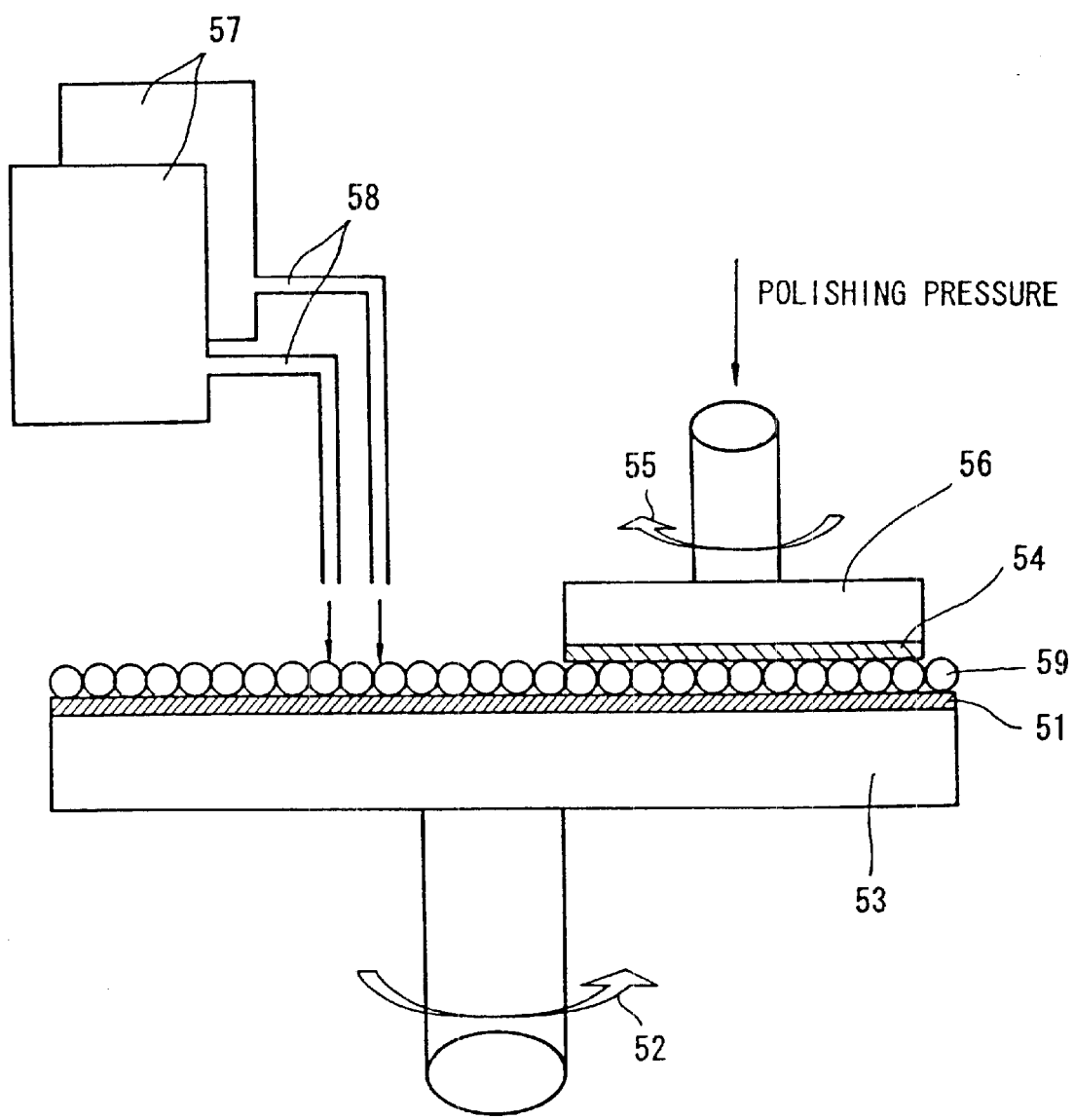
FIG. 5 is a schematic diagram which shows an index-type chemical mechanical polishing unit used in the third and fourth embodiments of the invention.

FIG. 5 shows an index-type chemical mechanical polishing unit used for polishing in the third and fourth embodiments explained later.

As shown in FIG. 5, the index-type chemical mechanical polishing unit includes, as its major components, a chuck 53 which holds a substrate 4 like a wafer to be polished and rotates in the arrow-marked direction 52 in FIG. 5 with an external driving force; a head 56 which has an abrasive plate 54 fixed thereto, rotates in the arrow-marked direction 55 in FIG. 5 with an external driving force, and urges the abrasive cloth 54 onto the chuck 53 under a polishing pressure; and slurry supply systems 57 which supply slurry. One of features of this unit lies in having two slurry supply systems 57. One of them supplies suspension-type slurry, and the other supplies non-suspension-type slurry. In a tank of the slurry supply system 7 for supplying non-suspension-type slurry, the slurry is stirred from time to time. From one end of a slurry supply opening 58 attached to the slurry supply system 57, slurry 59 is poured down to near the rotation center of the chuck 53, and the poured slurry 59 is spread over the substrate 51 due to a centrifugal force produced by rotation of the chuck 53. Then, while supplying the slurry 59 in this manner, both the chuck 53 and the head 56 are rotated to rub the substrate 51 with the abrasive cloth 54 and thereby grind the surface of the substrate 51. At that time, depending upon the material to be polished, namely, insulating film or metal film, chemical mechanical polishing is effected in a basic or acidic atmosphere.

Next explained is a method for manufacturing a memory-built-in semiconductor integrated circuit device according to the third embodiment of the invention. In the third embodiment, the index-type chemical mechanical polishing unit shown in FIG. 5 is used for surface smoothing in the process of making multi-layered wiring.

In the semiconductor integrated circuit device according to the third embodiment, after progressing the process up to formation of the Cu film 24 by electrolytic plating in the same manner as the first embodiment, the Cu film 24 is ground by using the index-type chemical mechanical polishing unit shown in FIG. 5 in the following manner. As the first step, one of the slurry supply systems 57 of the chemical mechanical polishing unit shown in FIG. 5 is selected for supplying non-suspension-type slurry, and while the non-suspension-type slurry is supplied onto the substrate from the slurry supply opening 58, polishing is conducted under the following conditions.

| | |
|---|---|
| Revolution of the abrasive plate: | 60 rpm |
| Revolution of the carrier: | 400 rpm |
| Polishing pressure | 5 psi |
| Temperature of the abrasive cloth: | 30 through 40° C. |
| Flow rate of slurry: | 50 ml/min |

Used in this process was slurry prepared by mixing alumina particles into a KOH water solution for alkalization.

As a result of this polishing using the non-suspension-type slurry, because a physical function by an urging pressure and non-suspension-type alumina particles produced additive effects and because the hydro plain phenomenon did not occur, the projection 24a was removed and smoothed although the surface after polishing was still rough.

After polishing with non-suspension-type slurry as explained above, the slurry supply system 57 of the index-type chemical mechanical polishing unit shown in FIG. 5 is changed to another for supplying suspension-type slurry, and while supplying this suspension-type slurry from the slurry supply opening 58, the second step polishing is conducted under the following conditions. In the second step, polishing is continued until the Cu film 24 on the inter-layer insulating film 22 is fully removed.

| | |
|---|---|
| Revolution of the abrasive plate: | 60 rpm |
| Revolution of the carrier: | 400 rpm |
| Polishing pressure | 5 psi |
| Temperature of the abrasive cloth: | 30 through 40° C. |
| Flow rate of slurry: | 50 ml/min |

Used in this process was slurry prepared by suspending alumina particles in a KOH water solution and an alcohol solution for its alkalization.

In this polishing using the suspension-type slurry, the surface roughly smoothed in the first step is smoothed compactly, and as shown in FIG. 4C, an excellent smoothed configuration can be obtained. Then, the Cu film 24 on the inter-layer insulating film 24 is fully removed, and remains only the via hole 23 to make up the plug 25.

According to the third embodiment, the same advantages as those of the first embodiment can be obtained.

Next explained is the fourth embodiment of the invention. The fourth embodiment is an application of the invention to formation of multi-layered wiring of a memory-built-in semiconductor integrated circuit device similarly to the first embodiment.

In the fourth embodiment, after progressing the process up to formation of the Cu film 24 by low-pressure CVD similarly to the second embodiment, the Cu film 24 is ground in the following manner by using the chemical mechanical polishing unit shown in FIG. 5. As the first step, one of the slurry supply systems 57 of the chemical mechanical polishing unit shown in FIG. 5 is selected for supplying non-suspension-type slurry, and while the non-suspension-type slurry is supplied onto the substrate from the slurry supply opening 58, polishing is conducted under the following conditions.

| | |
|---|---|
| Revolution of the abrasive plate: | 70 rpm |
| Revolution of the carrier: | 420 rpm |
| Polishing pressure | 5 psi |
| Temperature of the abrasive cloth: | 30 through 40° C. |
| Flow rate of slurry: | 50 ml/min |

Used in this process was slurry prepared by mixing alumina particles into a KOH water solution for alkalization.

As a result of this polishing using the non-suspension-type slurry, because a physical function by an urging pressure and non-suspension-type alumina particles produced additive effects and because the hydro plain phenomenon did not occur, the projection 24a was removed and smoothed although the surface after polishing was still rough.

After polishing with non-suspension-type slurry as explained above, the slurry supply system 57 of the index-type chemical mechanical polishing unit shown in FIG. 5 is changed to another for supplying suspension-type slurry, and while supplying this suspension-type slurry from the slurry supply opening 58, the second step polishing is conducted under the following conditions. In the second step, polishing is continued until the Cu film 24 on the inter-layer insulating film 22 is fully removed.

| | |
|---|---|
| Revolution of the abrasive plate: | 70 rpm |
| Revolution of the carrier: | 420 rpm |
| Polishing pressure | 5 psi |
| Temperature of the abrasive cloth: | 30 through 40° C. |
| Flow rate of slurry: | 50 ml/min |

Used in this process was slurry prepared by suspending alumina particles in a KOH water solution and an alcohol solution for its alkalization.

In this polishing using the suspension-type slurry, the surface roughly smoothed in the first step is smoothed compactly, and as shown in FIG. 4C, an excellent smoothed configuration can be obtained. Then, the Cu film 24 on the inter-layer insulating film 24 is fully removed, and remains only the via hole 23 to make up the plug 25.

According to the fourth embodiment, the same advantages as those of the first embodiment can be obtained.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

That is, numerical values, structures, configurations, materials, slurry, film deposition techniques, processes, and so on, indicated in the explanation of the first to fourth embodiments are not but mere examples, and any other appropriate numerical values, structures, configurations, materials, slurry, film deposition techniques, processes, and so on, may be employed, if so desired.

For example, although the first to fourth embodiments have been explained as conducting chemical mechanical polishing in two separate steps, it may be executed in three or more separate steps by using different types of slurry which are different in degree of dispersion of abrasive particles, if so desired.

Further, although the first and second embodiments use Cu as the metal for making the plug, aluminum (Al), tungsten (W), titanium (Ti), tantalum (Ta), platinum (Pt), ruthenium (Ru), or other like material, may be used in lieu of Cu, if so desired. As a technique for deposition of these metals, any appropriate method other than electrolytic plating or low-pressure CVD, such as selective CVD or ionized sputtering, may be used.

Additionally, although the first to fourth embodiments have been explained as applying this invention to making plugs, the invention is also applicable to fabrication of groove wiring.

Furthermore, any other appropriate unit may be used, if necessary, instead of the chemical mechanical polishing unit shown in FIG. 3 or 5. For example, the chemical mechanical polishing unit shown in FIG. 3 has two slurry supply systems 7 having two slurry supply openings 8. However, only one slurry supply opening 8 may be made, and slurry from two slurry supply systems 7 may be switched by manipulating a switching valve provided in a supply tube. This is possible also in the index-type chemical mechanical polishing unit shown in FIG. 3. If chemical mechanical polishing is performed in three or more separate steps by using different types of slurry which are different in degree of dispersion of abrasive particles, three or more slurry supply systems should be provided accordingly.

Moreover, although the first to fourth embodiments have been explained as applying the invention to fabrication of memory-built-in semiconductor integrated circuit devices, the invention is also applicable to fabrication of other various types of semiconductor integrated circuit devices.

As described above, according to the invention, by smoothing a substrate surface by conducting chemical mechanical polishing in a plurality of separate steps-using different types of slurry which are different in degree of dispersion of abrasive particles, polishing can be optimized, and an excellent, smoothed configuration can be obtained. Particularly, it is possible to attain local smoothing by removing local defective surface morphology while attaining global surface smoothing.

What is claimed is:

1. A method for manufacturing a semiconductor device, comprising:

covering a wiring layer by an inter-layer insulating film;

etching at least one via hole into the inter-layer insulating film;

depositing a metal film over the inter-layer insulating film and into the at least one via hole;

removing metal projections of the metal film by a polish by dispensing a mixed solution against the metal projections; and removing the metal film from the inter-layer insulating layer by at least one subsequent polish by dispensing a suspended solution against the metal film wherein the suspended solution contains an increased dispersion of abrasion particles than the mixed solution, the mixed solution prevents any thin liquid film from forming between the inter-layer insulating film and the abrasive cloth which allows the suspended solution to removed the remaining metal film from the inter-layer insulating layer.

2. The method of manufacturing the semiconductor device of claim 1, wherein the metal film is copper.

3. The method of manufacturing the semiconductor device of claim 1, wherein the metal film is deposited by electrolytic plating.

4. The method of manufacturing the semiconductor device of claim 3, further comprising rotating the abrasive plate at 60 rpm during the polish by dispensing the mixed solution.

5. The method of manufacturing the semiconductor device of claim 4, further comprising rotating the carrier at 400 rpm during the polish by dispensing the mixed solution.

6. The method of manufacturing the semiconductor device of claim 5, further comprising pressuring the abrasive plate against the carrier at 5 psi during the polish by dispensing the mixed solution.

7. The method of manufacturing the semiconductor device of claim 6, further comprising maintaining a temperature of the abrasive cloth between 30° C. and 40° C. during the polish by dispensing, the mixed solution.

8. The method of manufacturing the semiconductor device of claim 7, further comprising dispensing the mixed solution at 50 ml/min during the polish by dispensing the mixed solution.

9. The method of manufacturing the semiconductor device of claim 8, further comprising maintaining the same rotations, temperature, pressure and dispensing rate in the subsequent polish as in the polish by dispensing the mixed solution.

10. The method of manufacturing the semiconductor device of claim 1, wherein the mixed solution is prepared by mixing alumina particles into a KOH water solution for alkalization.

11. The method of manufacturing the semiconductor device of claim 1, wherein the suspended solution is prepared by suspending alumina particles into a KOH water solution and an alcohol solution for alkalization.

12. The method of manufacturing the semiconductor device of claim 1, further comprising rotating an abrasive plate at 50 rpm during the polish by dispensing the mixed solution.

13. The method of manufacturing the semiconductor device of claim 12, further comprising rotating a carrier at 17 rpm during the polish by dispensing the mixed solution.

14. The method of manufacturing the semiconductor device of claim 13, further comprising pressuring the abrasive plate against the carrier at 20 psi during the polish by dispensing the mixed solution.

15. The method of manufacturing the semiconductor device of claim 14, further comprising maintaining a temperature of an abrasive cloth between 30° C. and 40° C. during the polish by dispensing the mixed solution.

16. The method of manufacturing the semiconductor device of claim 15, further comprising the mixed solution at 250 ml/min during the polish by dispensing the mixed solution.

17. The method of manufacturing the semiconductor device of claim 16, further comprising maintaining the same rotations, temperature and dispensing rate in the at least one subsequent polish as in the polish by dispensing the mixed solution.

18. The method of manufacturing the semiconductor device of claim 17, further comprising pressuring the abrasive plate against the carrier at 10 psi during the subsequent polish.

19. A method for manufacturing a semiconductor device, comprising:

covering a wiring layer by an inter-layer insulating film;

etching at least one via hole into the inter-layer insulating film;

depositing a metal film by low pressure chemical vapor deposition over the inter-layer insulating film and into the at least one via hole;

removing metal projections of the metal film by a first polish by dispensing a mixed solution at 250 ml/min against the metal projections while rotating an abrasive plate at 65 rpm, rotating a carrier at 22 rpm, pressuring the abrasive plate against the carrier at 20 psi during the rotations, maintaining a temperature of an abrasive cloth between 30° C. and 40° C., and removing the metal film from the inter-layer insulating layer by a second polish by dispensing a suspended solution against the metal film wherein the mixed solution prevents any thin liquid film from forming between the inter-layer insulating film and the abrasive cloth which allows the suspended solution to remove the remaining metal film from the inter-layer insulating layer.

20. The method of manufacturing the semiconductor device of claim 19, further comprising dispensing the suspended solution at 250 ml/min against the metal projections.

21. The method of manufacturing the semiconductor device of claim 19, further comprising rotating the abrasive plate at 65 rpm and rotating the carrier at 22 rpm during the second polish.

22. The method of manufacturing the semiconductor device of claim 19, further comprising pressuring the abrasive plate against the carrier at 10 psi during the second polish.

23. The method of manufacturing the semiconductor device of claim 19, further comprising maintaining the temperature of the abrasive cloth between 30° C. and 40° C. during the second polish.

24. A method for manufacturing a semiconductor device by a polisher having an abrasive plate, a carrier and an abrasive cloth, comprising:

covering a wiring layer by an inter-layer insulating film;

etching at least one via hole into the inter-layer insulating film;

depositing a copper film by low pressure chemical vapor deposition over the inter-layer insulating film and into the at least one via hole;

removing metal projections of the copper film by a first polish by dispensing a mixed solution at 50 ml/min against the metal projections, rotating the abrasive plate at 70 rpm while rotating the carrier at 420 rpm, pressuring the abrasive plate against the carrier at 5 psi, maintaining a temperature of the abrasive cloth between 30° C. and 40° C.; and removing the copper film from the inter-layer insulating layer by a second polish by dispensing a suspended solution at 50 ml/min against the copper film wherein the mixed solution prevents any thin liquid film from forming between the inter-layer insulating film and the abrasive cloth which allows the suspended solution to remove the remaining copper film from the inter-layer insulating layer.

25. The method of manufacturing the semiconductor device of claim 24, further comprising maintaining the same rotations, temperature, pressure and dispensing rates in the second polish as in the first polish.

\* \* \* \* \*